US009951785B2

(12) United States Patent
David et al.

(10) Patent No.: US 9,951,785 B2
(45) Date of Patent: *Apr. 24, 2018

(54) AIR-MOVING ASSEMBLIES WITH FLYWHEELS

(71) Applicant: INTERNATIONAL BUSINESS MACHINES CORPORATION, Armonk, NY (US)

(72) Inventors: Milnes P. David, Fishkill, NY (US); Michael J. Domitrovits, New Paltz, NY (US); Joshua Murphy, Milton, NY (US); John V. Palmer, Central Valley, NY (US); Sal M. Rosato, Pine Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/241,480

(22) Filed: Aug. 19, 2016

(65) Prior Publication Data

US 2016/0360650 A1    Dec. 8, 2016

Related U.S. Application Data

(63) Continuation of application No. 14/494,924, filed on Sep. 24, 2014, now Pat. No. 9,464,634.

(51) Int. Cl.
*H05K 7/20* (2006.01)
*F04D 25/02* (2006.01)
(Continued)

(52) U.S. Cl.
CPC ........... *F04D 25/026* (2013.01); *F04D 17/16* (2013.01); *F04D 19/002* (2013.01); *F04D 25/08* (2013.01);
(Continued)

(58) Field of Classification Search
CPC ................... H05K 7/20136; F04D 19/00
(Continued)

(56) References Cited

U.S. PATENT DOCUMENTS 2,826,096 A   3/1958   Hodge
3,236,122 A   2/1966   Biemson
(Continued)

FOREIGN PATENT DOCUMENTS

CN    2012-41864 Y    5/2009
CN    203443046 U     2/2014
(Continued)

OTHER PUBLICATIONS

Campbell et al., Notice of Allowance for U.S. Pat. No. 9,504,188 B2, dated Aug. 2, 2016, (19 pages).
(Continued)

*Primary Examiner* — Mukund G Patel
(74) *Attorney, Agent, or Firm* — Teddi Maranzano; Kevin P. Radigan, Esq.; Heslin, Rothenberg, Farley & Mesiti, P.C.

(57) ABSTRACT

Apparatuses and methods are provided for facilitating air-cooling of, for instance, one or more electronics racks within a data center. The apparatus includes an air-moving assembly and one or more flywheels. The air-moving assembly includes a shaft, one or more mechanical fans coupled to the shaft to rotate, at least in part, with the shaft, and a motor coupled to the shaft to rotatably drive the shaft. The flywheel (s) is sized and coupled to the shaft of the air-moving assembly to store rotational energy, and to facilitate, for a specified period of time, continued rotation of the shaft during interruption in power to the motor. In one implementation, the flywheel(s) is sized and coupled to the shaft to facilitate, for the specified time period, continued rotation of the shaft at a specified percentage, or greater, rotational
(Continued)

speed of the shaft compared with shaft speed when rotatably driven by the motor.

16 Claims, 9 Drawing Sheets

(51) Int. Cl.
*F04D 25/16* (2006.01)
*F04D 27/00* (2006.01)
*F04D 17/16* (2006.01)
*F04D 19/00* (2006.01)
*F04D 25/08* (2006.01)
*H02H 7/09* (2006.01)

(52) U.S. Cl.
CPC ......... *F04D 25/166* (2013.01); *F04D 27/005* (2013.01); *H02H 7/09* (2013.01); *H05K 7/20136* (2013.01); *H05K 7/20745* (2013.01); *F05B 2260/302* (2013.01); *F05B 2260/421* (2013.01)

(58) Field of Classification Search
USPC .................................................. 361/679.48
See application file for complete search history.

(56) References Cited

U.S. PATENT DOCUMENTS

| | | | |
|---|---|---|---|
| 4,086,781 A | 5/1978 | Brody et al. | |
| 4,339,779 A | 7/1982 | Kalbach et al. | |
| 6,573,626 B1 | 6/2003 | Gosebruch et al. | |
| 6,574,963 B1 | 6/2003 | Tadayon et al. | |
| 6,657,320 B1 | 12/2003 | Andrews et al. | |
| 6,702,661 B1 | 3/2004 | Clifton et al. | |
| 7,127,895 B2 | 10/2006 | Pinkerton et al. | |
| 7,177,151 B2 | 2/2007 | Van Lear et al. | |
| 7,200,005 B2 | 4/2007 | Von Gutfeld et al. | |
| 7,274,566 B2 | 9/2007 | Campbell et al. | |
| 7,462,954 B2 | 12/2008 | Kraus | |
| 7,681,395 B2 | 3/2010 | Pinkerton et al. | |
| 7,750,518 B1 | 7/2010 | Perkins | |
| 7,866,959 B2 * | 1/2011 | Barsun | F04D 25/02 417/423.5 |
| 7,878,007 B2 | 2/2011 | Campbell et al. | |
| 8,360,931 B2 | 1/2013 | Keeney et al. | |
| 8,544,575 B1 | 10/2013 | Scaringe et al. | |
| 8,671,686 B2 | 3/2014 | Pinkerton et al. | |
| 8,941,256 B1 | 1/2015 | Czamara et al. | |
| 9,141,155 B2 | 9/2015 | Wiley | |
| 9,144,181 B2 | 9/2015 | Wiley | |
| 9,464,634 B2 | 10/2016 | David et al. | |
| 9,504,188 B1 | 11/2016 | Campbell et al. | |
| 9,568,011 B2 | 2/2017 | David et al. | |
| 2006/0059936 A1 | 3/2006 | Radke et al. | |
| 2007/0139883 A1 | 6/2007 | Pinkerton, III et al. | |
| 2011/0215645 A1 | 9/2011 | Schomburg et al. | |
| 2012/0309284 A1 | 12/2012 | Dernis et al. | |
| 2014/0039852 A1 | 2/2014 | Zhang et al. | |
| 2016/0084257 A1 | 3/2016 | David et al. | |
| 2016/0088764 A1 | 3/2016 | David et al. | |

FOREIGN PATENT DOCUMENTS

| | | |
|---|---|---|
| JP | H07120592 A | 5/1995 |
| KR | 10-2008-0007943 A | 1/2008 |

OTHER PUBLICATIONS

David et al., "Replacement List of IBM Patents & Patent Applications Treated as Related", U.S. Appl. No. 15/241,480, filed Aug. 19, 2016, dated Feb. 24, 2017 (2 pages).

Campbell et al., "Air-Moving Assembly with Auxiliary Turbine Drive", U.S. Appl. No. 15/953,634, filed Nov. 30, 2015 (49 pages).

Campbell et al., Notice of Allowance for U.S. Appl. No. 14/953,634, filed Nov. 30, 2015, dated Aug. 2, 2016 (19 pages).

David et al., Office Action for U.S. Appl. No. 14/494,924, filed Sep. 24, 2014 (U.S. Patent Publication No. 2016/0088764 A1), dated Mar. 3, 2016 (17 pages).

David et al., "List of IBM Patents & Patent Applications Treated as Related", U.S. Appl. No. 15/241,480, filed Aug. 19, 2016, dated Aug. 29, 2016 (2 pages).

\* cited by examiner

AIR-MOVING ASSEMBLIES WITH FLYWHEELS

BACKGROUND

In many server applications, processors, along with their associated electronics (e.g., memory, disk drives, power supplies, etc.), are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack(s), including the electronic subsystems thereof. As one solution, cooling apparatuses may be provided which include one or more air-moving assemblies (e.g., axial fans, centrifugal fans) which facilitate moving airflow through the electronics racks, typically front-to-back. These fans are in addition to the computer-room, air-moving assemblies, such as computer-room air-conditioner (CRAC) units or computer-room air-handler (CRAH) units, which provide air movement within the data center, and thus, cooling to the data center. To meet the ever-growing need for providing continuous cooling to the electronics racks of a data center, further air-handling enhancements are needed.

BRIEF SUMMARY

The shortcomings of the prior art and additional advantages are provided through the provision, in one aspect, of an apparatus which includes an air-moving assembly, at least one flywheel, and a motor decoupling mechanism. The air-moving assembly includes: a shaft, one or more mechanical fans coupled to the shaft to rotate, at least in part, with the shaft; and a motor coupled to the shaft to rotatably drive the shaft. The at least one flywheel is coupled to the shaft of the air-moving assembly, with the one or more mechanical fans coupled to the shaft between the motor and the at least one flywheel. The at least one flywheel stores rotational energy during motor operation, and facilitates, for a specified period of time, continued rotation of the shaft during interruption in power to the motor. The motor decoupling mechanism is coupled to the shaft between the motor and the one or more mechanical fans. The motor decoupling mechanism includes a clutch coupling the shaft to a drive shaft of the motor, where the drive shaft drives rotation of the shaft when the motor is operating, and the clutch automatically decouples the shaft from the drive shaft during interruption in power to the motor.

In another aspect, a data center is provided which includes at least one electronics rack to be cooled, an air-moving assembly, at least one flywheel, and a motor decoupling mechanism. The air-moving assembly facilitates, at least in part, air-cooling of the at least one electronics rack, and includes: a shaft; one or more mechanical fans coupled to the shaft to rotate, at least in part, with the shaft; and a motor coupled to the shaft to rotatably drive the shaft. The at least one flywheel is coupled to the shaft of the air-moving assembly, with the one or more mechanical fans coupled to the shaft between the motor and the at least one flywheel. The at least one flywheel stores rotational energy during motor operation, and facilitates, for a specified period of time, continued rotation of the shaft during interruption in power to the motor. The motor decoupling mechanism is coupled to the shaft between the motor and the one or more mechanical fans. The motor decoupling mechanism includes a clutch coupling the shaft to a drive shaft of the motor, where the drive shaft drives rotation of the shaft when the motor is operating, and the clutch automatically decouples the shaft from the drive shaft during interruption in power to the motor.

In a further aspect, a method is provided which includes: providing at least one flywheel for an air-moving assembly, the air-moving assembly including: a shaft; one or more mechanical fans coupled to the shaft to rotate, at least in part, with the shaft; and a motor coupled to the shaft to rotatably drive the shaft; rotatably coupling the at least one flywheel to the shaft of the air-moving assembly, wherein the at least one flywheel is sized and coupled to the shaft, with the one or more mechanical fans coupled to the shaft between the motor and the at least one flywheel, to store rotation energy therein during motor operation, and to facilitate, for a specified period of time, continued rotation of the shaft during interruption in power to the motor, and wherein the at least one flywheel is sized and coupled to the shaft to facilitate, for the specified period of time, the continued rotation of the shaft at a pre-specified percentage, or greater, rotational speed of the shaft compared with a rotational speed of the shaft when rotatably driven by the motor; and providing a motor decoupling mechanism coupled to the shaft between the motor and the one or more mechanical fans, the motor decoupling mechanism comprising a clutch coupling the shaft to a drive shaft of the motor, the drive shaft driving rotation of the shaft when the motor is operating, and the clutch automatically decoupling the shaft from the drive shaft during interruption in power to the motor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
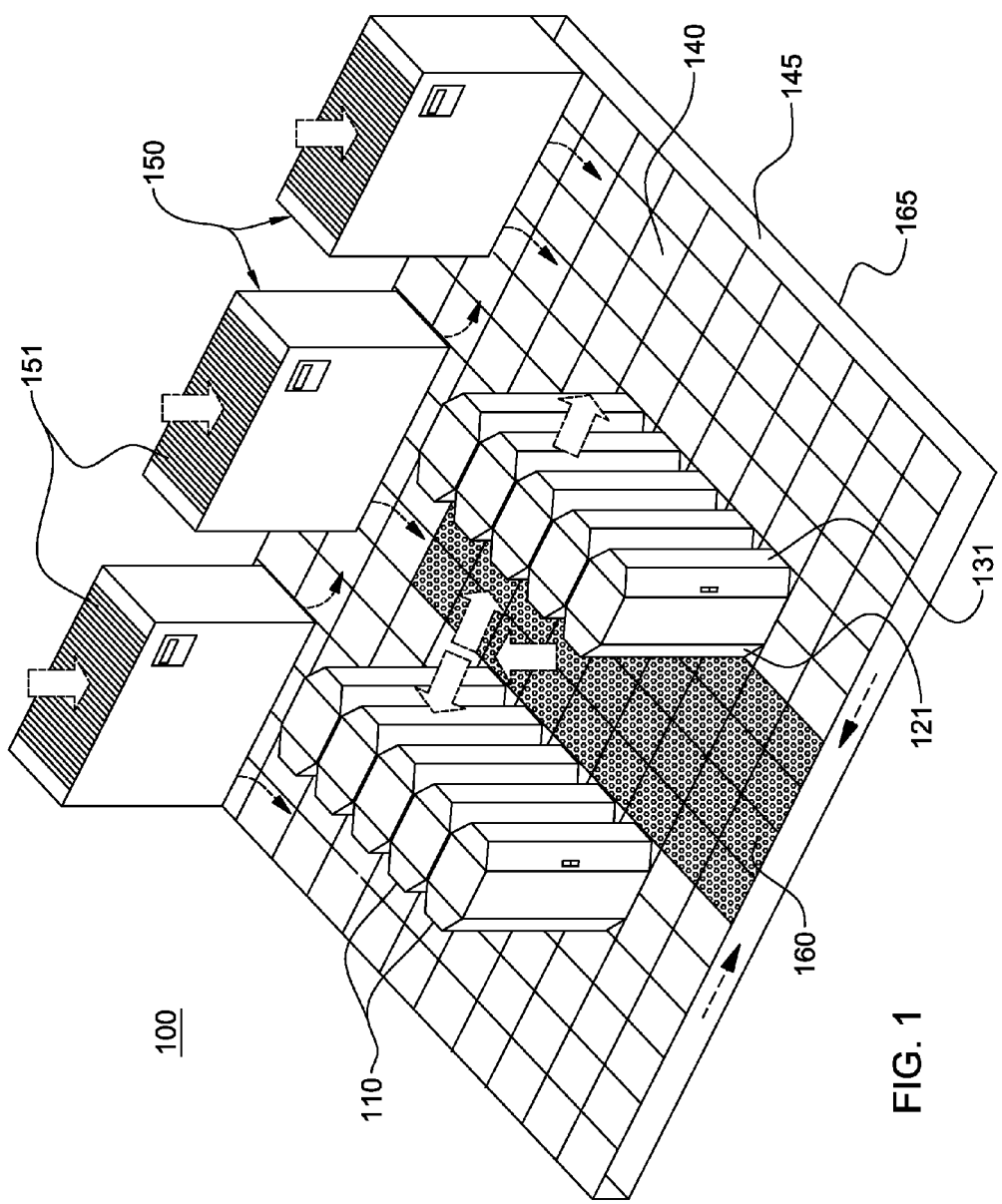
FIG. 1 depicts one embodiment of a data center or computer-room having a plurality of computer-room, air-moving assemblies, in accordance with one or more aspects of the present invention.

As used herein, the terms "electronics rack" and "rack unit" are used interchangeably, and unless otherwise specified include any housing, frame, rack, compartment, blade server system, etc., having one or more heat generating components of a computer system or electronic system, and may be, for example, a stand-alone computer processor having high, mid or low end processing capability. In one embodiment, an electronics rack may include one or more electronic systems or subsystems, each having one or more heat generating components requiring cooling. An electronic system or subsystem of an electronics rack may be movable or fixed relative to the electronics rack, with the electronics drawers of a multi-drawer rack unit and blades of a blade center system being two examples of systems or subsystems of an electronics rack to be cooled. In one specific example, "electronic subsystem" may refer to a part of an electronic system, and may be, in one example, a server node of a multi-server rack.

As used herein, "air-to-coolant heat exchanger" includes any heat exchange mechanism characterized as described herein through which a coolant can circulate; and includes, one or more discrete air-to-coolant heat exchangers coupled either in series or in parallel. An air-to-coolant heat exchanger may include, for example, one or more coolant flow paths, formed of thermally conductive tubing (such as copper or other tubing) in thermal communication with a plurality of cooling fins. Size, configuration and construction of the air-to-coolant heat exchanger can vary without departing from the scope of the invention disclosed herein. Unless otherwise specified, "heat exchanger" is used herein to refer to generally to an air-to-liquid heat exchanger or an air-to-air heat exchanger. Further, "data center" refers to a computer installation containing one or more electronic systems, electronics racks, etc., to be cooled. As a specific example, a data center may include one or more rows of rack-mounted computing units, such as server units.

As used herein, air flows "across" the heat exchanger and "coolant" flows "through" the heat exchanger. Flowing across the heat exchanger refers to air passing across the outside of the conductive tubing forming the one or more coolant flow paths, while flowing through the heat exchanger refers to the fluid passing through the heat exchanger's one or more coolant flow paths formed by the conductive tubing. Depending upon the embodiment, the "fluid" may be either gaseous (e.g., air) or liquid (e.g., water). Further, by way of example only, the air-moving assembly is described hereinbelow in certain implementations as a computer-room air-conditioner (CRAC) unit or computer-room air-handler (CRAH) unit.

One example of the coolant employed in an air-to-coolant heat exchanger is a liquid, such as water. However, the concepts disclosed herein are readily adapted to use with other types of liquid coolant. For example, one or more of the coolants may comprise a brine, a fluorocarbon liquid, a liquid metal, or other similar coolant, or refrigerant, while still maintaining the advantages and unique features of the present invention. Further, in certain alternate embodiments, an air-to-air heat exchanger may be employed wherein the coolant is cooled air forced or drawn through the heat exchanger. Thus, unless otherwise specified, the word "coolant" is used herein as either a gaseous coolant or a liquid coolant.

Reference is made below to the drawings, where the same reference numbers used throughout different figures designate the same or similar components.

FIG. 1 depicts one embodiment of a raised floor, data center layout 100. In this layout, multiple electronics racks 110 are disposed in one or more rows. A computer installation such as depicted in FIG. 1 may house several hundred, or even several thousand, processors. In the arrangement of FIG. 1, cooled air enters the computer-room via floor vents from a supply air plenum 145 defined between the raised floor 140 and a base or sub-floor 165 of the room. Cooled air is taken in through louvered air inlet sides 121 of the electronics racks 110 and expelled through louvered air outlet sides 131 of the electronics racks. One or more electronics racks 110 may have one or more an air-moving devices (e.g., axial and/or centrifugal fans) to provide forced inlet-to-outlet airflow to cool the electronic components within the rack unit. The supply air plenum 145 provides, in one embodiment, cooled air to the air inlet sides of the electronics racks via perforated floor tiles 160 disposed in one or more "cold" aisles of the computer-room installation. The cooled air is supplied to plenum 145 by one or more computer-room, air-moving assemblies 150, also disposed within the data center 100. Room air is taken in through vents 151 into and cooled by computer-room, air-moving assemblies 150, and this room air comprises in part exhausted air from the "hot" aisles of the computer-room installation defined, for example, by opposing air outlet sides of electronics racks 110.

Figure 2:
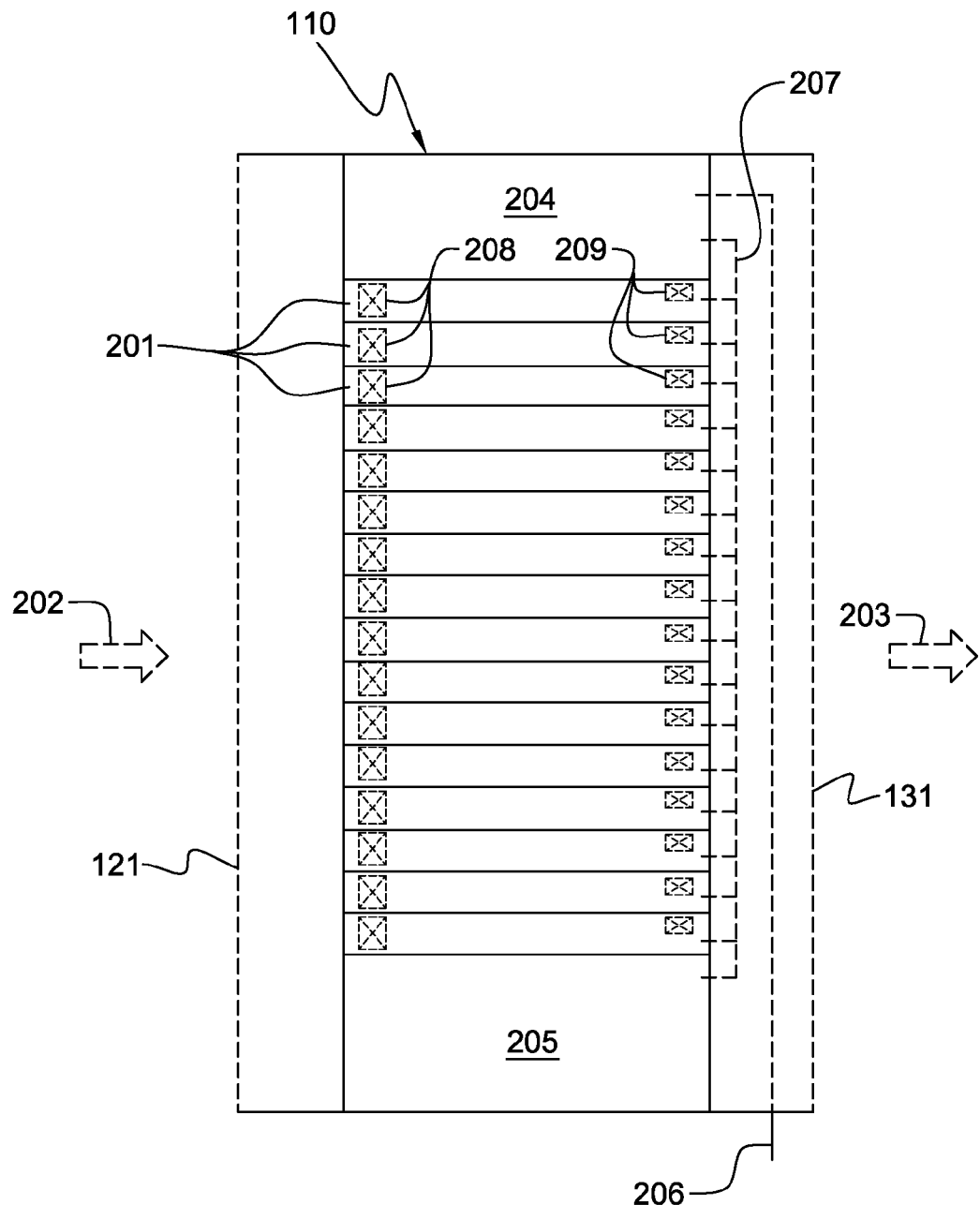
FIG. 2 is a cross-sectional elevational view of one embodiment of an electronics rack of the data center of FIG. 1 being air-cooled, in accordance with one or more aspects of the present invention.

FIG. 2 depicts (by way of example) one embodiment of an electronics rack 110 with a plurality of electronic subsystems 201 to be cooled. In the embodiment illustrated, electronic subsystems 201 are air-cooled by cool airflow 202 ingressing via air inlet side 121, and exhausting out air outlet side 131 as hot airflow 203. By way of example, one or more air-moving assemblies 208 may be provided at the air inlet sides of electronic subsystems 201 and/or one or more air-moving assemblies 209 may be provided at the air outlet sides of electronic subsystems 201 to facilitate airflow through the individual subsystems 201 as part of the cooling apparatus of electronics rack 110. For instance, air-moving assemblies 208 at the air inlets to electronic subsystems 201 may be or include axial fan assemblies, and air-moving assemblies 209 disposed at the air outlets of electronic subsystems 201 may be or include centrifugal fan assemblies. One or more of electronic subsystems 201 may include heat-generating components to be cooled of a computer system, electronics system, and/or information technology (IT) equipment. For example, one or more of the electronic subsystems 201 may include one or more processors and associated memory.

Electronics rack 110 may also include, by way of example, one or more bulk power assemblies 204 of an AC to DC power supply assembly. AC to DC power supply assembly further includes, in one embodiment, a frame controller, which may be resident in the bulk power assembly 204 and/or in one or more electronic subsystems 201. Also illustrated in FIG. 2 is one or more input/output (I/O) drawer(s) 205, which may also include a switch network. I/O drawer(s) 205 may include, as one example, PCI slots and disk drivers for the electronics rack.

In the depicted implementation, a three-phase AC source feeds power via an AC power supply line cord 206 to bulk power assembly 204, which transforms the supplied AC power to an appropriate DC power level for output via distribution cable 207 to the plurality of electronic subsystems 201 and I/O drawer(s) 205. The number of electronic subsystems installed in the electronics rack is variable, and depends on customer requirements for a particular system. Further, although described with reference to electronic subsystems 201, air-moving assemblies could alternatively, or also, reside within, for instance, bulk power assembly 204, or I/O drawer(s) 205. Again, the particular electronics rack 110 configuration of FIG. 2 is presented by way of example only, and not by way of limitation.

Figure 3:
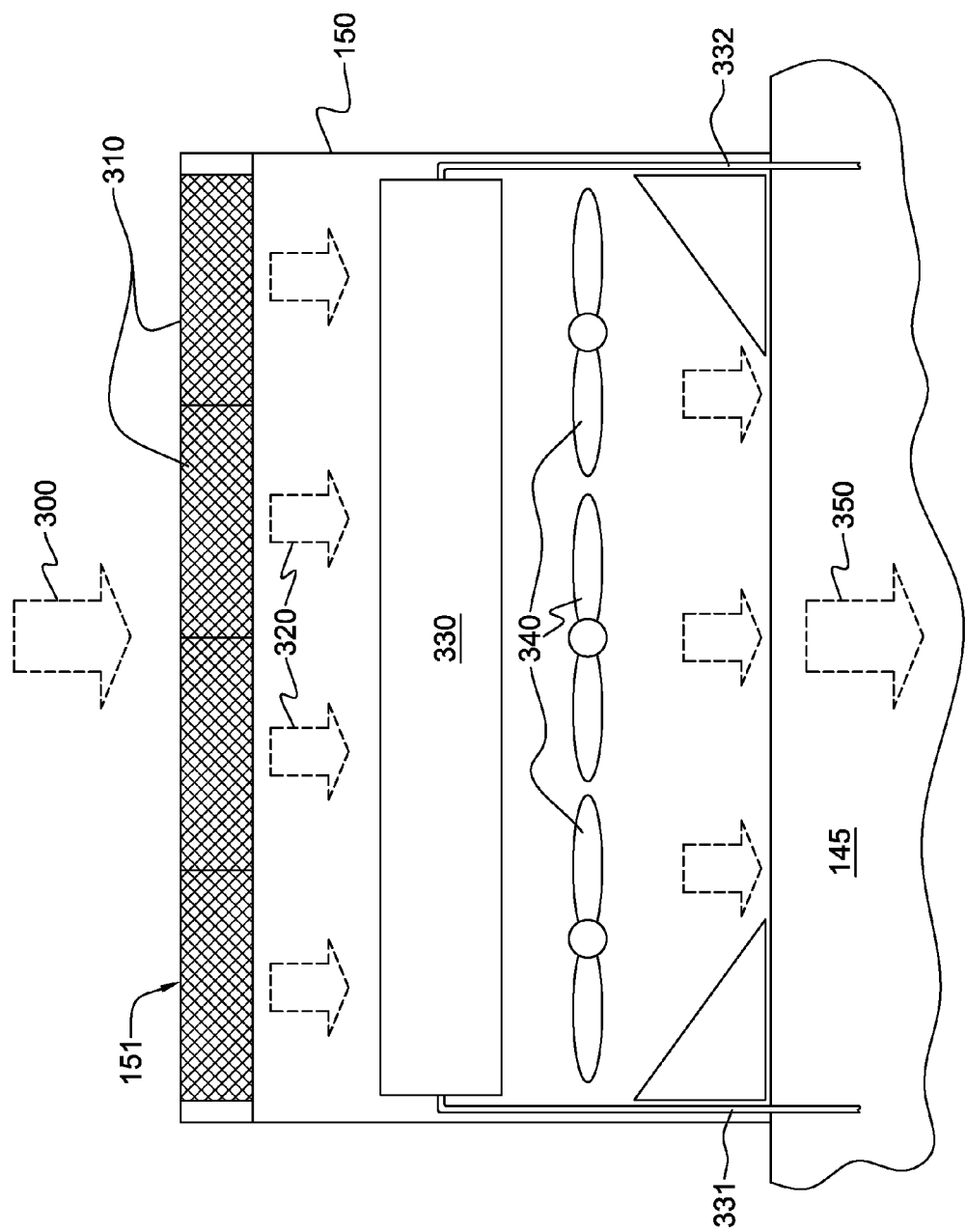
FIG. 3 is a cross-sectional elevational view of one embodiment of a computer-room, air-moving assembly of the data center of FIG. 1, and which is to be modified in accordance with one or more aspects of the present invention.

By way of example only, FIG. 3 illustrates one embodiment of a computer-room, air-moving assembly 150, which in this example, is a computer-room air-conditioner (CRAC) unit with a top to bottom airflow design, and which is configured to provide temperature-conditioned air for electronics rack cooling in a raised floor data center configuration, such as depicted in FIG. 1. As illustrated, warm computer-room air 300 enters the CRAC unit via an open vent 151 at an air inlet of the CRAC unit, and optionally flows through a set of air filters 310. After passing through air filters 310, the filtered warm air 320 is cooled as it passes across an air-to-coolant heat exchanger 330. Coolant is provided to air-to-coolant heat exchanger 330 via a coolant supply line 331 and coolant return line 332. The filtered, warm air 320 is drawn across air-to-coolant heat exchanger 330 via one or more mechanical fans 340 (e.g., axial or centrifugal fans) disposed, for instance, in the lower portion of computer-room, air-moving assembly 150. The cooled air 350 is pushed by mechanical fans 340 into space 145 under the raised floor to create the pressurized plenum needed to facilitate raised floor data center cooling via the perforated tiles discussed above with reference to FIG. 1. The air-to-coolant heat exchanger may be supplied (in one example) with sub-ambient chilled coolant from a refrigeration chiller. This chilled coolant absorbs heat from the warm air passing across the air-to-coolant heat exchanger, and rejects the heat to the refrigeration chiller plant (not shown).

In order to provide continuous operation of an electronics rack(s), the electronics rack(s) may be provided with an Uninterruptable Power Supply (UPS) system, which maintains operation of the electronic system(s) within the rack(s) in the event of a utility power disruption to the data center. When utility power is lost to a data center, the air-moving assemblies, such as computer-room air-conditioner (CRAC) units or computer-room air-handler (CRAH) units, typically lose power as well until the utility power is restored, or back-up generators become operational. Conventionally, it has been unnecessary to have the computer-room, air-moving assemblies on a UPS system, due to a relatively large cooling margin between the actual data center environmental operating conditions, and the point where the electronics rack(s), or more specifically the electronic system(s) or information technology (IT) equipment within the electronics rack(s), could overheat, automatically shut down, and possibly becoming damaged. With greater emphasis on energy efficiency within a data center, however, the allowable environmental operating temperatures have risen, thus reducing the amount of time that a data center cooling apparatus or system can be interrupted without negatively affecting the electronics.

As a solution, an Uninterruptable Power Supply (UPS) system could be installed for the one or more computer-room, air-moving assemblies within the data center. However, this would require significant initial capital investment, as well as generating significant ongoing maintenance expenses. Further, installing UPS systems for computer-room, air-moving assemblies on a typical data center floor could require a sizable amount of floor or building space, due to the system's relatively large size.

An alternative solution disclosed herein is to associate one or more flywheels with an air-moving assembly to advantageously provide cooling or thermal ride-through in the event of a power interruption, at least until back-up generators are brought online to provide backup power to the air-moving assembly. As data centers migrate for energy efficiency reasons towards increasing rack inlet temperatures to the maximum allowable by ASHRAE TC 9.9, additional risk to achieving thermal ride-through if a utility power interruption arises in the data center. By adding an appropriately sized and coupled flywheel(s) to an air-moving assembly, such as the above-noted CRAC units or CRAH units, enough inertia can be stored for the mechanical fans within the air-moving assembly to continue, for a specified period of time, to rotate at at least a pre-specified rotational speed, and provide continued air-cooling to the data center floor; that is, at least for a brief, specified time or interval, until emergency power or normal utility power is anticipated to become available and the air-moving assemblies can resume operation. Note in this regard that, in the event of a utility power interruption, cool air continues to remain in the cool air plenum, and the air-to-coolant heat exchangers continue to cool any air passing through the air-moving assembly.

Using a flywheel(s) sized and coupled as disclosed herein provides additional cooling time to the data center floor in the event of a utility power interruption to the air-moving assembly, and may be used alternatively or in combination with a UPS system. Advantageously though, the flywheel solutions disclosed herein are more cost effective, require significantly less space, may be purchased incrementally with the data center cooling units, require less maintenance, and eliminate battery concerns compared to providing one or more UPS systems for cooling ride-through within the data center in the event of a utility power interruption, at least for a relatively brief time period, for instance, sufficient for backup generator power to come online.

As noted, in many mission-critical data centers, air-moving assemblies of the data center are not on an Uninterruptable Power Supply (UPS) system. Thus, during a power outage, the air-moving assemblies (such as CRAC/CRAH units) lose power for the duration of time it takes for the data center generators to start up and provide power to the equipment. Depending upon how the data center is prioritized, this could take, for instance, 60-90 seconds, or longer, before the air-moving assemblies are supplied with back-up power. Since most information technology (IT) equipment is on a UPS system, the heat being produced within the data center by this equipment continues to dissipate into the room at the same or greater rate than it did prior to the power interruption. By adding one or more appropriately-sized flywheels to an air-moving assembly of the data center, the effect of the power disturbance to the electronics rack(s), and more particularly, the IT equipment within the rack(s), can be minimized. The flywheel(s) can be configured, sized and coupled to provide enough stored rotational energy to keep the mechanical fans of the air-moving assembly rotating for a specific amount of time at a specified rotational speed (or greater), providing continued airflow within the data center to cool the electronics racks.

Generally stated, disclosed herein are apparatuses, data centers, and methods which incorporate or associate one or more flywheels with an air-moving assembly, such as a computer-room, air-moving assembly. The apparatus may include, in certain implementations, the air-moving assembly, which may comprise a shaft; one or more mechanical fans coupled to the shaft to rotate, at least in part, with the shaft; and a motor coupled to the shaft to rotatably drive the shaft. By way of example, the one or more mechanical fans may comprise one or more axial fans and/or one or more centrifugal fans. The flywheel(s) is configured, sized and coupled to the shaft of the air-moving assembly to store rotational energy during motor operation and to facilitate, for a specified period of time, continued rotation of the shaft during interruption in power to the motor.

The dimensions and weight of the one or more flywheels may be dependent on the shaft material and construction, and for instance, the required, specified thermal ride-through time, as well as the rotational resistance of the shaft. In certain implementations, the dimensions and weight of the flywheel(s) may be based on the air-moving assembly model and ride-through requirements. A large, heavy flywheel could provide longer ride-through at the expense of requiring a more powerful drive motor and higher energy consumption during normal operation, particularly at system start-up. Further, the one or more flywheels may be coupled to the shaft at any available location along the shaft, and where multiple flywheels are provided, the multiple flywheels may be located at different positions along the shaft of the air-moving assembly.

In certain implementations, the flywheel(s) is sized and coupled to the shaft to facilitate, for the specified period of time, continued rotation of the shaft at a specified percentage, or greater, rotational speed of the shaft compared with a rotational speed of the shaft when rotatably driven by the motor. For instance, the specified period of time may be an anticipated amount of time from the utility power interruption to the motor within which motor power can be reestablished within the data center, either by utility power coming back online, or for instance, by backup power generation becoming available.

Advantageously, the air-moving assembly of the apparatus may include or be a computer-room, air-moving assembly providing, at least in part, air movement within a data center having one or more electronics racks to be cooled. For instance, the air-moving assembly may be, in certain embodiments, a computer-room air-conditioner (CRAC) unit, or a computer-room air-handler (CRAH) unit. In one or more other embodiments, the air-moving assembly may be associated with a room or housing containing one or more heat-generating components to be cooled. For instance, the air-moving assembly may be associated with a room containing one or more UPS systems for a data center.

In certain implementations, the air-moving assembly may include multiple mechanical fans coupled to the shaft to rotate with the shaft. In such an implementation, one or more flywheels could be coupled to the shaft between two adjacent mechanical fans of the multiple mechanical fans coupled to the shaft, provided there is sufficient space within the air-moving assembly housing, or could be disposed adjacent to an end of the shaft. Alternatively, a flywheel extender housing could be provided coupled to the air-moving assembly housing. In this manner, larger flywheel dimensions may be accommodated. Note that in certain implementations, where multiple flywheels are provided, two or more of the flywheels may be differently sized and/or configured dependent, for instance, on available space within or about the air-moving assembly.

In one or more implementations, it may be advantageous to couple the flywheel(s) to the shaft through a shaft extender mechanically coupled to the shaft to rotate therewith. For instance, where the flywheel(s) is provided within a flywheel extender housing, then coupling a shaft extender to the shaft of the air-moving assembly allows the one or more flywheels within the extender housing to be coupled to the shaft and rotate with the shaft (that is, through the shaft extender). In an alternate embodiment, the shaft of the air-moving assembly could be replaced with a longer shaft that extends, at least in part, into the flywheel extender housing to facilitate coupling the flywheel(s) to the shaft.

In certain implementations, a drive belt assembly couples the flywheel(s) to the shaft. The drive belt assembly may include a gearing mechanism providing an increased rotational speed to the flywheel(s) in comparison to the rotational speed of the shaft. By way of example, the specified period of time may be achieved by the flywheel(s) being appropriately sized, and the increased rotational speed being selected, to achieve a set time period from a utility power interruption for the continued rotation of the shaft at a specified percentage, or greater, rotational speed of the shaft compared with a rotational speed of the shaft when rotatably driven by the motor in normal operation. For instance, in one implementation, it may be desirable for the specified period of time to be 60 or 90 seconds, and the specified percentage to be about 50%. That is, at 60 or 90 seconds after an interruption in utility power to the motor, causing operation of the motor to cease, the flywheel(s) is sized and coupled to the shaft in a manner which allows for the shaft to continue to rotate at at least 50% of the rotational speed at which the shaft would be operating at under normal conditions, with the motor powered.

In one or more implementations, an electromotive force (emf) decoupling mechanism is provided which automatically open circuits during an interruption in power to the motor, and prevents the continued rotation of the shaft during the interruption in power to the motor from providing a back electromotive force through the motor. In one implementation, the emf decoupling mechanism includes an electromagnetic switch which is electrically coupled to a circuit line provided to power the motor. The electromagnetic switch automatically switches to an open circuit state with loss of power to the motor through the circuit line. In certain other embodiments, a motor decoupling mechanism may be provided, which includes a clutch mechanism coupling the shaft to a drive shaft of the motor. The drive shaft drives rotation of the shaft when the motor is operating, and the clutch mechanism automatically decouples the shaft and the drive shaft responsive to the interruption in power to the motor. Various mechanical or electromechanical clutch mechanisms may be employed for this purpose.

As noted, in one implementation only, the air-moving assembly is a computer-room air-conditioner (CRAC) unit, and the CRAC unit includes an air-to-coolant heat exchanger, which provides cooled air to a data center. In this implementation, the flywheel(s) may be sized and coupled to provide, for the specified period of time, the continued rotation of the shaft to facilitate the computer-room air-conditioner unit providing additional cooled air to the data center during the interruption in power to the motor, wherein the flywheel(s) is sized and coupled to the shaft to facilitate, for the specified period of time, the continued rotation of the shaft at a specified percentage, or greater, rotational speed of the shaft compared with the rotational speed of the shaft when rotatably driven by the motor.

Figure 4:
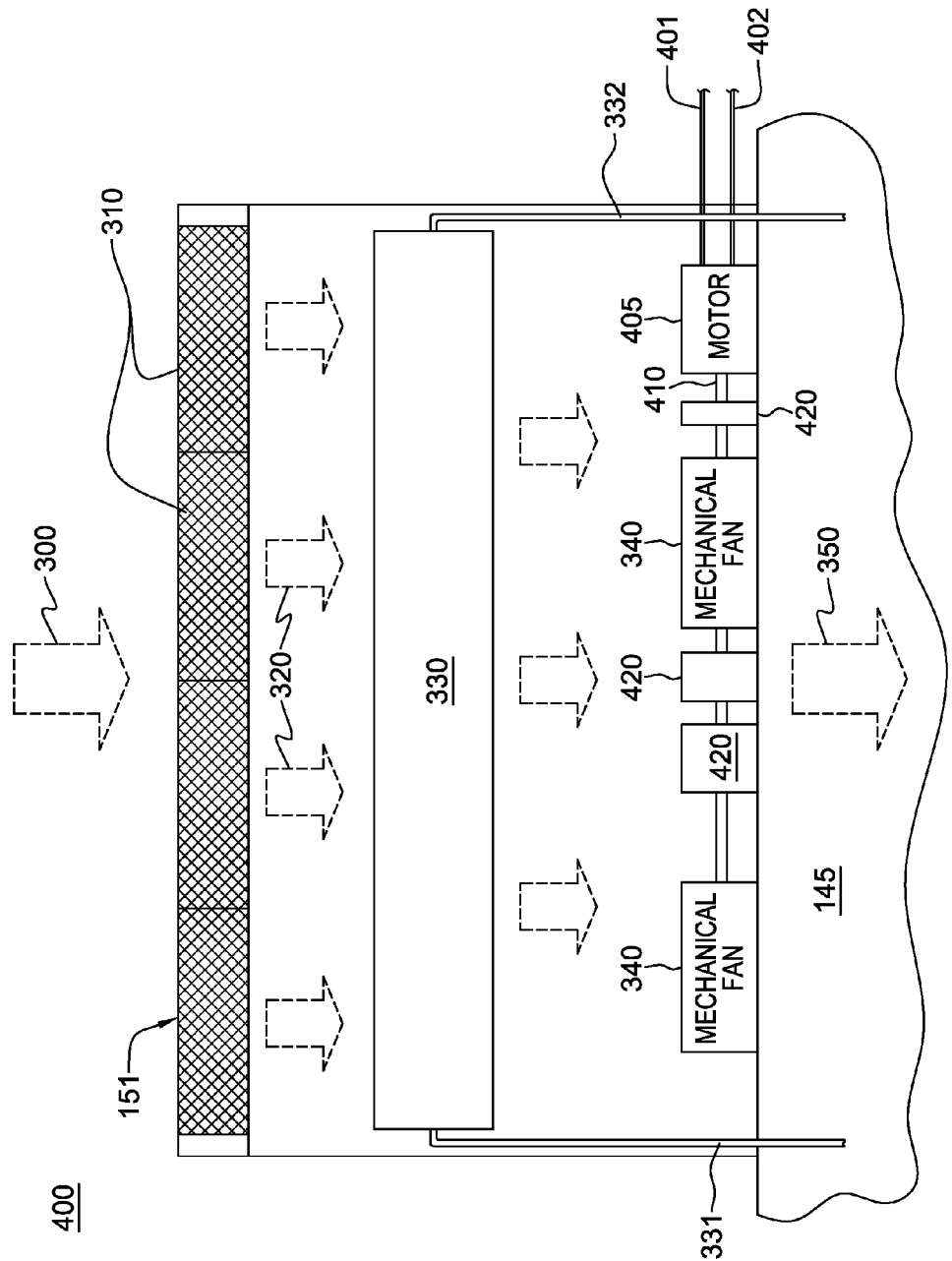
FIG. 4 is a cross-sectional elevational view of one embodiment of an apparatus comprising an air-moving assembly and multiple flywheels for, for instance, the data center of FIG. 1, in accordance with one or more aspects of the present invention.

FIG. 4 illustrates one embodiment of an apparatus comprising an air-moving assembly 400 configured, in this example, as a computer-room, air-moving assembly, and more specifically, as a computer-room air-conditioner (CRAC) unit with a top-to-bottom airflow design. The embodiment illustrated in FIG. 4 is particularly useful for cooling one or more electronics racks of a data center having a raised floor configuration, with an under-floor cool air plenum, such as depicted in FIG. 1. Note that this implementation of the air-moving assembly builds upon the computer-room, air-moving assembly 150 of FIG. 3, and is provided by way of example only.

As illustrated, and as partially explained above in connection with the embodiment of FIG. 3, warm computer-room air 300 enters air-moving assembly 400 via one or more open inlet vents 151 at an air inlet of the assembly, and optionally flows through a set of air filters 310. After passing through air filters 310, the filtered, warm air 320 is cooled as it passes across one or more air-to-coolant heat exchanger(s) 330. Coolant is provided to the heat exchanger via coolant supply line 331 and coolant return line 332. The filtered, warm air 320 is drawn across air-to-coolant heat exchanger(s) 330 via, in this example, multiple mechanical fans 340, such as multiple centrifugal fans disposed (by way of example only) in the lower portion of the air-moving assembly. The cooled air 350 is pushed by mechanical fans 340 into space 145 under the raised floor to create the pressurized plenum needed to facilitate raised floor data center cooling via the perforated tiles discussed above. As noted, the air-to-coolant heat exchanger(s) may be supplied (in one example) with sub-ambient chilled coolant from a refrigeration chiller. This chilled coolant absorbs heat from the warm air passing across the air-to-coolant heat exchanger(s), and rejects the heat to the refrigerant chiller plant (not shown).

In the depicted embodiment of FIG. 4, a shaft 410 couples a motor 405 to mechanical fans 340. The mechanical fans are coupled to shaft 410 to rotate, at least in part, with the shaft, and the motor is coupled to the shaft to rotatably drive the shaft. Electrical circuit lines 401, 402 are provided to power motor 405 via, for instance, utility power, or alternatively, backup generated power produced by one or more electric generators (not shown) associated with the data center.

Multiple flywheels 420 are coupled to shaft 410, for instance, in between adjacent mechanical fans 340 and/or motor 405, and within the housing of air-moving assembly 400. The flywheels 420 may be differently (or similarly) configured, sized and coupled in respective manners to store rotational energy during motor 405 operation, and to collectively facilitate, for a specified period of time, continued rotation of the shaft during interruption in power to the motor to provide a cooling-ride-through to the data center during the power interruption. As noted, the defined period of time may be pre-specified to be, for instance, 60-90 seconds, or more, depending upon the particular implementation of the air-moving assembly, and the anticipated time required to reestablish motor operation, either by restoring utility power, or bringing backup power online using one or more generators associated with the data center. For instance, if the defined period of time is 60 seconds, and at 60 seconds it is desired that the rotational speed of the mechanical fans 340 be about one half of that of the speed during normal operation of the motor, then the following set of specified conditions may be obtained, in one example:

Start: $t=0$ s: speed=1092 RPM, 11,000 CFM, 7.3 hp

Final: $t=60$ s: speed=580 RPM, 6000 CFM, 1.2 hp

From these specified conditions, the necessary energy to be stored in the flywheel can be determined to be approximately 170 kJ (ignoring additional frictional losses). This amount of energy storage can be achieved, in one embodiment, by a solid, cylindrical flywheel with a mass of 1900 kg, and a flywheel dimension of 0.2 m radius, and a length of 2 m. In one embodiment, the flywheel may be fabricated of steel; however, other materials may additionally or alternatively be employed.

By way of further explanation, the flywheel dimensions may be determined as follows:

$$\text{Energy In} - \text{Energy Out} = \text{Energy in Flywheel}, \tag{1}$$

When power is lost, energy is no longer supplied to the flywheel and Energy In=0.

$$\text{Energy in Flywheel} = -\text{Energy out}, \tag{2}$$

$$\text{Energy in Flywheel} = \tfrac{1}{2} \cdot I \cdot w(t)^2, \tag{3}$$

Where w(t)=rotational velocity at time t, I=moment of inertia of flywheel.

$$EnergyOut = \int_{t_i}^{t_f} P(t) \cdot dt, \tag{4}$$

Where P(t)=power supplied at time t.

Thus the following equation can be solved:

$$\frac{1}{2} \cdot I \cdot (w_i^2 - w_f^2) = \int_{t_i}^{t_f} P(t) \cdot dt, \tag{5}$$

Where $w_i$ is the initial rotational speed in rad/s and $w_f$ is the final rotational speed in rad/s.

Using fan laws, the power needed by the fan mechanisms (and thus to be supplied by the flywheel):

$$P(t) = P_i \cdot \left(\frac{w(t)}{w_i}\right)^3, \quad (6)$$

Where $P_i$=initial power supplied, $w(t)$=rotational velocity at time t, $w_i$=initial rotational velocity.

For a simple solid disk/cylinder:

$$I = \tfrac{1}{2} \cdot m \cdot R^2, \quad (7)$$

Where m=mass of flywheel, R=outside radius of flywheel.

Using equations (1)-(7), equation (8) can be derived:

$$\tfrac{1}{4} \cdot m \cdot R^2 \cdot (w_i^2 - w_f^2) = \frac{P_i}{w_i^3} \int_{t_i}^{t_f} w(t)^3 \cdot dt. \quad (8)$$

For the specific application discussed:

$t_i$=0 seconds, $w_i$=111.5 rad/s, $P_i$=7.4 HP=5513 W $t_f$=60 seconds, $w_f$=61 rad/s, Pf=1.2 HP=895 W Assuming a linear reduction in speed from 100% at t=0 seconds to 50% at t=60 seconds:

$$w(t) = w_i - 0.837 \cdot t. \quad (9)$$

With the specific application requirements equation (8) simplifies to:

$$\tfrac{1}{4} \cdot m \cdot R^2 \cdot (w_i^2 - w_f^2) = 166460, \quad (10)$$

$$m \cdot R^2 = 76. \quad (11)$$

For a cylinder:

$$m = \rho \cdot \pi \cdot R^2 \cdot H, \quad (12)$$

$$\rho \cdot \pi \cdot R^4 \cdot H = 76. \quad (13)$$

Where $\rho$ is the density of the material of the flywheel, R is the outer radius and H is the length or thickness of the flywheel.

Equation (13) can thus be solved for a given material and space to obtain the appropriate dimensions of the flywheel.

Figure 5:
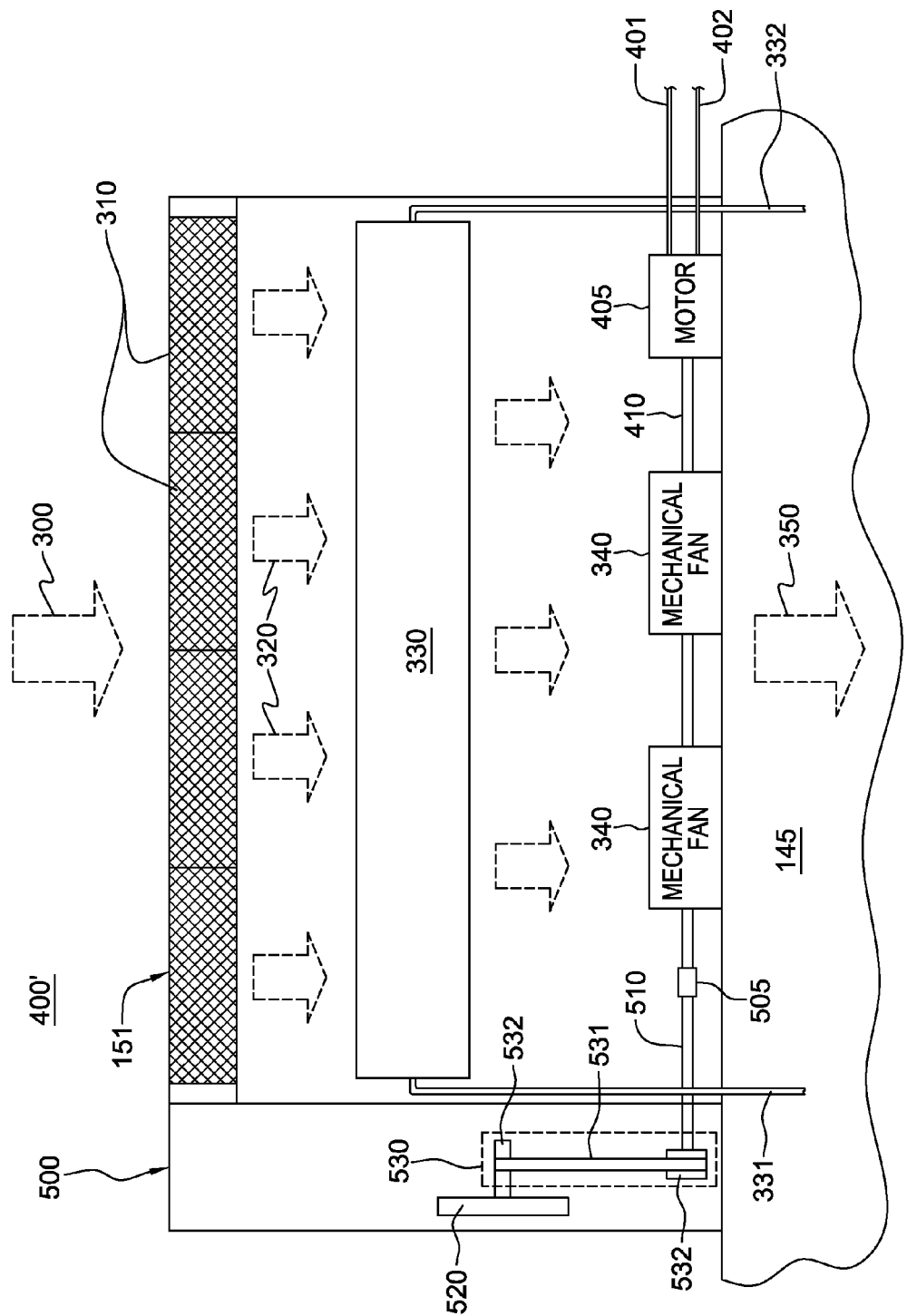
FIG. 5 is a cross-sectional elevational view of another embodiment of an apparatus comprising an air-moving assembly and at least one flywheel, in accordance with one or more aspects of the present invention.

FIG. 5 depicts an alternate embodiment of an air-moving assembly 400', in accordance with one or more aspects of the present invention. Air-moving assembly 400' is similar to that described above in connection with FIG. 4, however, rather than reside within the assembly, between adjacent mechanical fans 340, the flywheel(s) 520 is provided within a flywheel extender housing 500 attached (in one embodiment) to a side of air-moving assembly 400'. In this implementation, a mechanical coupler 505 couples a shaft extender 510 to shaft 410 so as to rotate therewith. The shaft extender extends into flywheel extender housing 500 containing flywheel(s) 520. Note that, as an alternate implementation, shaft 410 could be replaced with a longer shaft extending from the air-moving assembly into flywheel extender housing 500.

In the illustrated implementation, a belt drive assembly 530 is provided coupling flywheel(s) 520 to shaft extender 510. The belt drive assembly 530 includes a belt 531 and a gearing mechanism 532. In one implementation, gearing mechanism 532 provides an increased rotational speed to flywheel(s) 520 in comparison with a rotational speed of shaft 410 in normal operation. The specified period of time for the flywheel to effect continuing rotation of shaft 410 during a power outage may be provided by appropriately sizing flywheel(s) 520 and selecting the increased rotational speed (for instance, through the gearing mechanism 532) to achieve the desired time period for the continued rotation of the shaft in which to allow motor operation to be reestablished.

Using the same assumptions as presented above for the embodiment of FIG. 4, a desired energy storage in the flywheel of approximately 170 kJ may be achieved in the example of FIG. 5 using a flywheel gearing ratio of about 5, and a disk-shaped flywheel, with a mass of 330 kg, and flywheel dimensions of 0.3 m radius, and 1.5 cm thick.

Note again that the configuration, dimensions and weight of the flywheel(s) are dependent on, in part, the specified period of time that the flywheel(s) is to continue to rotatably drive the shaft during interruption in power to the motor. The dimensions and weight of the flywheel(s) may depend on the shaft material and construction, the required cooling (or thermal) ride-through time, the rotational resistance of the shaft, as well as the particular air-moving assembly model. A large, heavy flywheel would provide longer ride-through time, but at the expense of requiring a more powerful drive motor and higher energy consumption during normal operation.

One issue with an apparatus such as described above in connection with FIGS. 4 & 5 is the possibility for an electromotive force (emf) to be generated during power outage back through the motor onto the electrical circuit lines. This back emf could create additional rotational resistance at the motor by generating more friction, slowing down the flywheel and mechanical fans, thereby negatively affect the cooling ride-through provided by the flywheel(s).

Figure 6A:
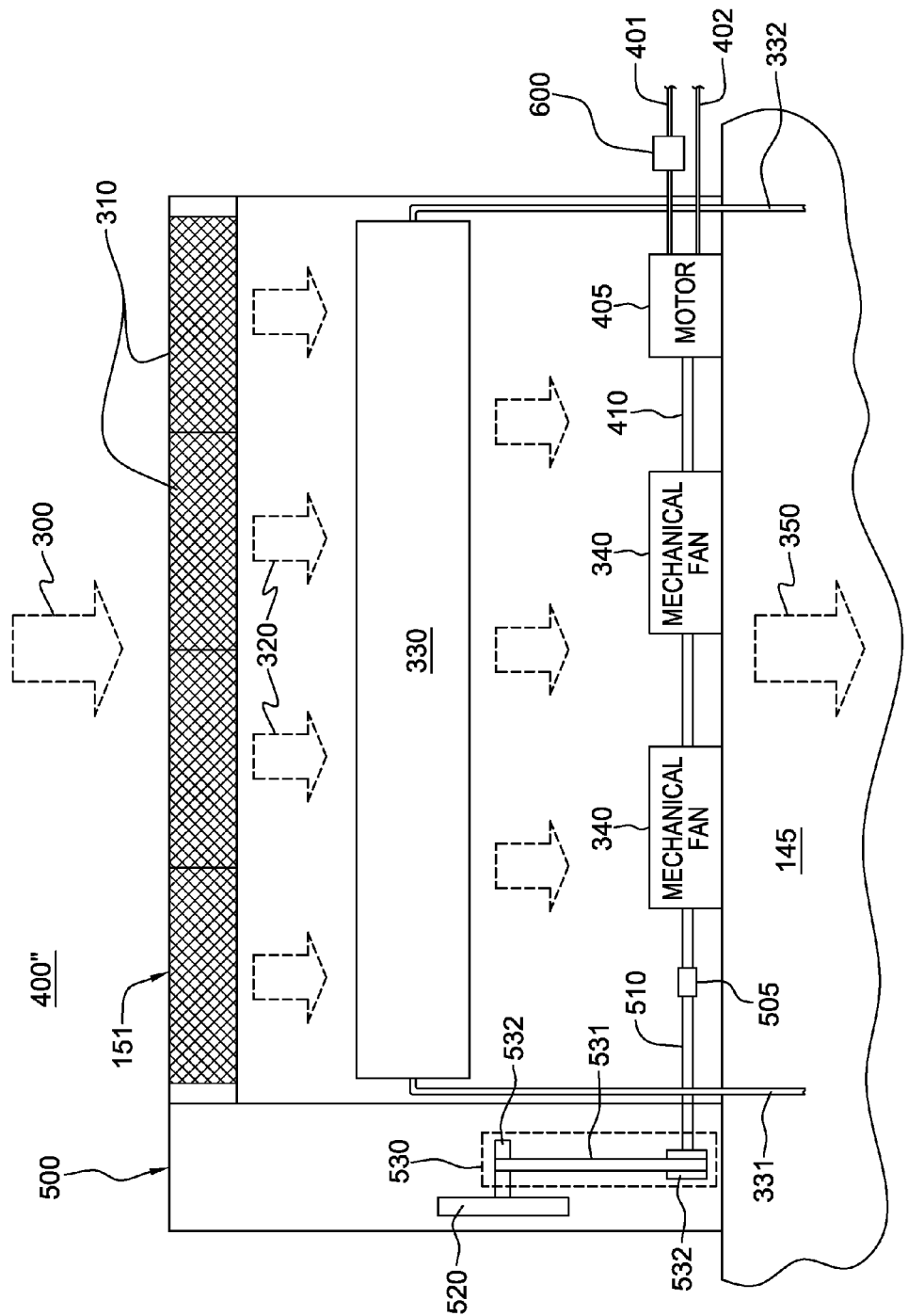
FIG. 6A is a cross-sectional elevational view of a further embodiment of an apparatus comprising an air-moving assembly and at least one flywheel, in accordance with one or more aspects of the present invention.
Figure 6B:
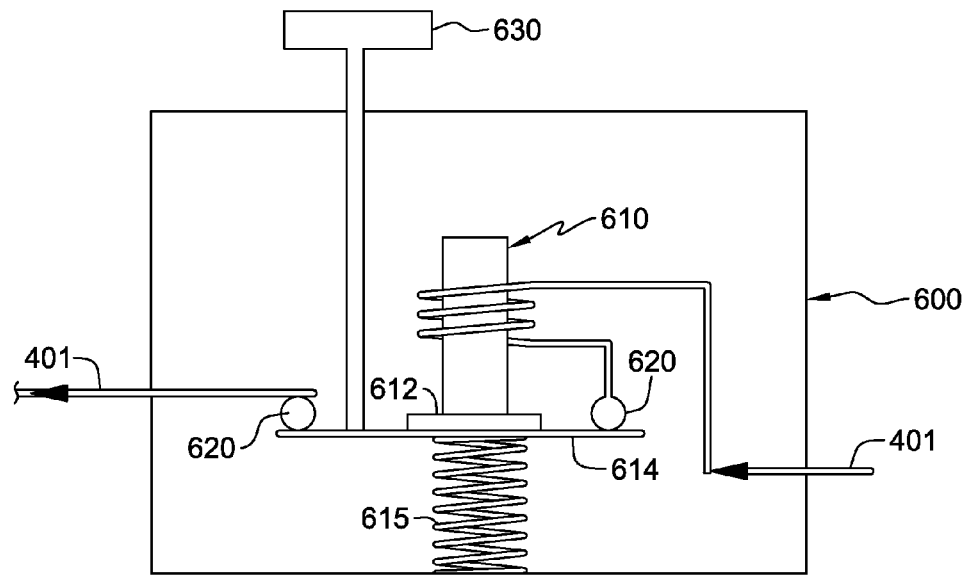
FIG. 6B depicts one embodiment of the electromotive force (emf) decoupling mechanism of the apparatus of FIG. 6A, with the electromagnetic switch shown in closed circuit state, in accordance with one or more aspects of the present invention.
Figure 6C:
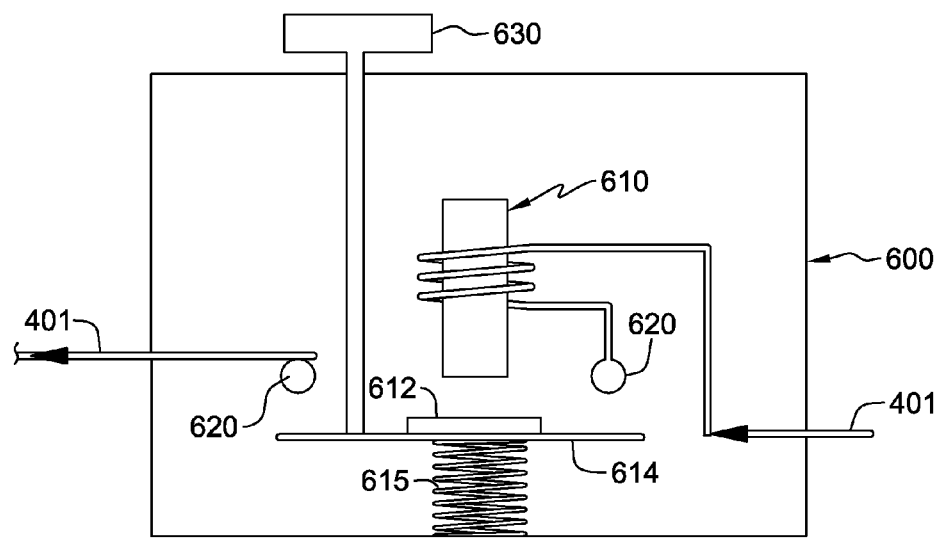
FIG. 6C depicts the emf decoupling mechanism of FIG. 6B, with the electromagnetic switch shown in open-circuit state, responsive to, for instance, power loss to the motor of the air-moving assembly, in accordance with one or more aspects of the present invention.

FIGS. 6A-6C depict one solution to this issue. In these figures, an electromotive force (emf) decoupling mechanism is provided, which is depicted as an electromagnetic switch 600 coupled, for instance, to circuit line 401 providing power to motor 405 during normal operation. In implementation, the electromagnetic switch automatically switches to an open circuit state with loss of power to the motor through the circuit line 401. This will prevent electromotive force from being generated back onto circuit line 401, and thereby minimize frictional losses at motor 405 due to continued shaft rotation during the interruption in power to the motor, thereby improving conversion of the stored rotational energy in the flywheel(s) to rotation of the shaft, and thus, rotation of the mechanical fans. Further, once back emf is negated, the momentum or inertia within the motor rotor will assist in continued shaft rotation during the interruption in power to the motor.

FIGS. 6B & 6C depict one embodiment of electromagnetic switch 600, with the switch shown in closed circuit state in FIG. 6B, and open circuit state in FIG. 6C. As illustrated, in normal, closed circuit operation, power is supplied to the motor of the air-moving assembly, and an electromagnet 610 is energized to hold a permanent magnet 612 in contact, which in turn holds a conductive plate 614 in electrical contact with switch contacts 620, overcoming a spring 615 biasing of conductive plate 614 and permanent magnet 612 away from the terminals.

As illustrated in FIG. 6C, when power on circuit line 401 is lost, the electromagnetic force pulling permanent magnet 612 towards electromagnet 610 is interrupted, and spring 615 pulls conductive plate 614 away from switch contacts 620, open circuiting the electromagnetic switch, and thereby automatically decoupling the motor from the circuit line, and preventing electromotive force (emf) back into the circuit line from the motor resulting from continued rotation of the shaft driven by the flywheel. In one embodiment, the electromagnetic switch may be reset to closed circuit state using a manual reset 630 coupled to conductive plate 614, that is, to bring permanent magnet 612 back into contact with electromagnet 610 to reestablish flow of current through the switch once power is restored. Note that in this implementation, the circuit line is automatically open circuited upon a power loss through the circuit line, which automatically avoids back electromotive force being generated by motor 405 onto the line.

Figure 7A:
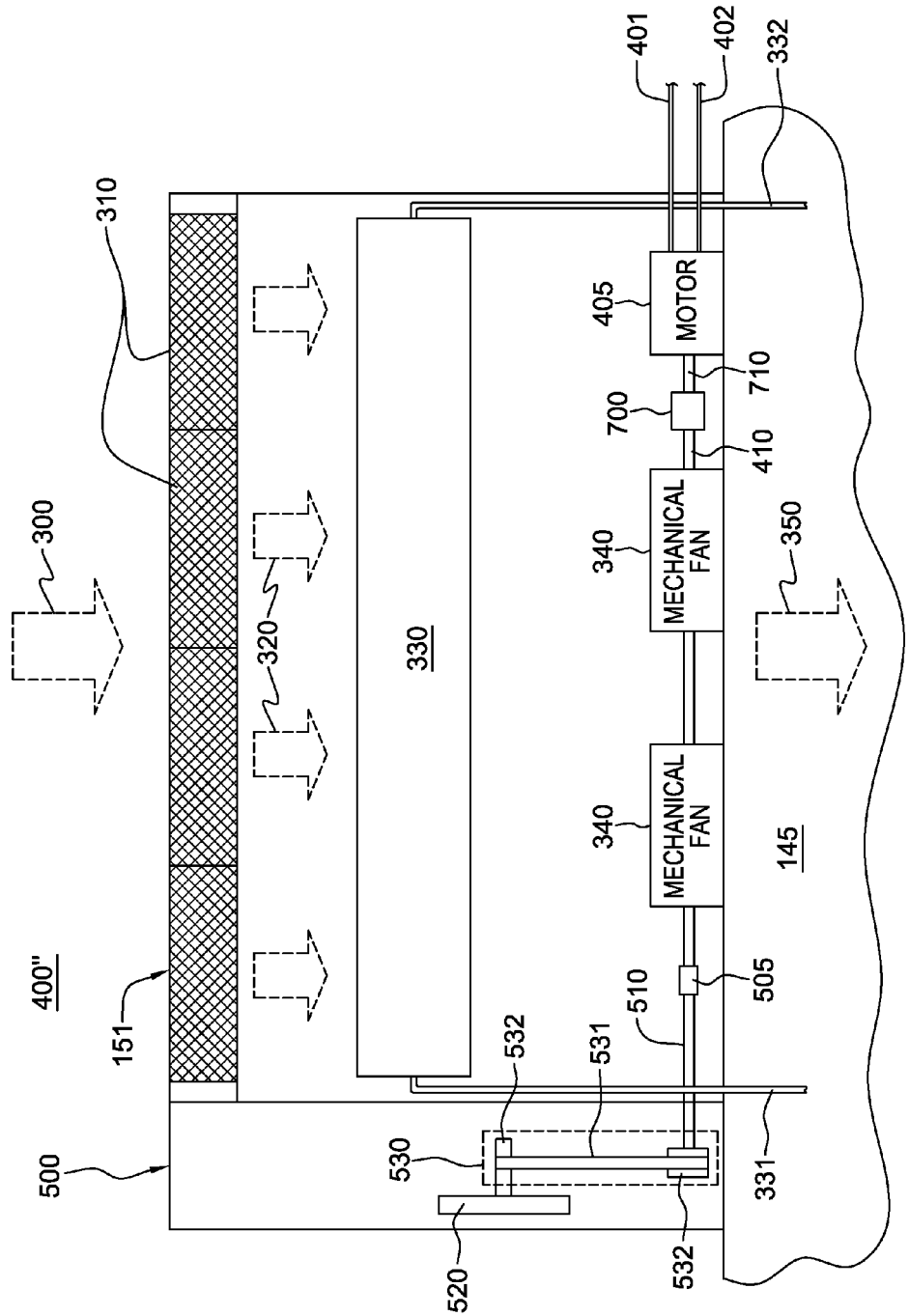
FIG. 7A depicts a cross-sectional elevational view of another embodiment of an apparatus comprising an air-moving assembly, one or more flywheels, and a motor decoupling mechanism, in accordance with one or more aspects of the present invention.
Figure 7B:
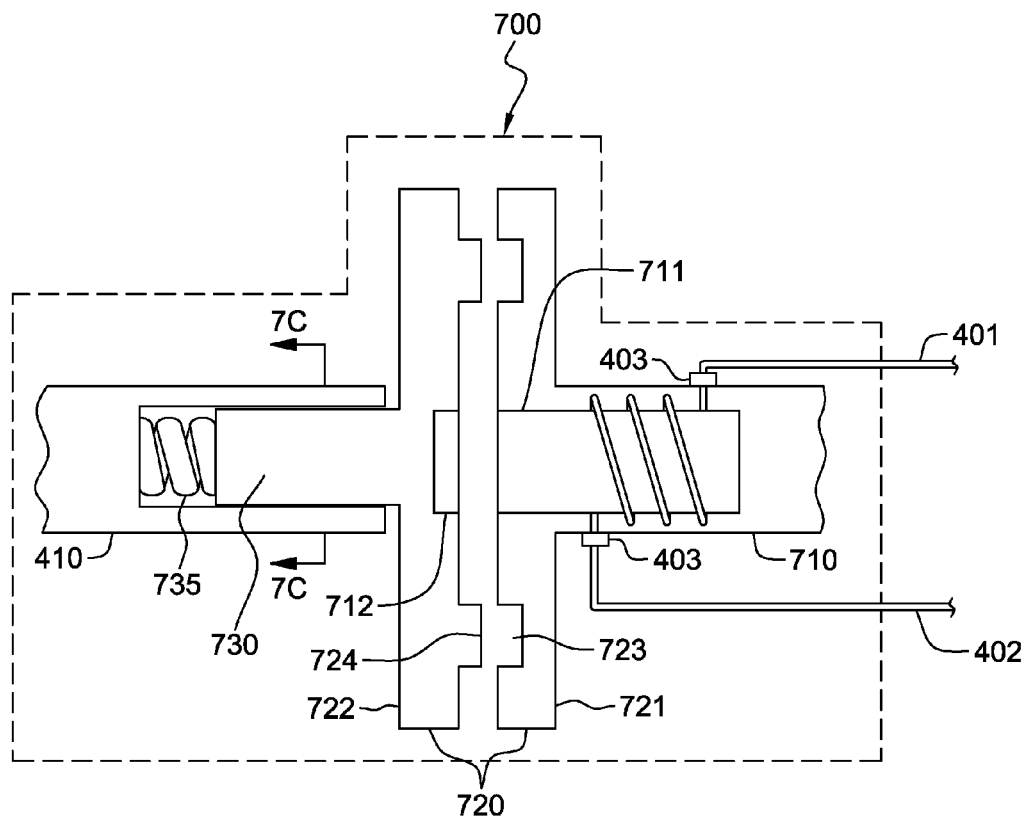
FIG. 7B depicts one embodiment of the motor decoupling mechanism, or clutch, of the apparatus of FIG. 7A, in accordance with one or more aspects of the present invention.
Figure 7C:
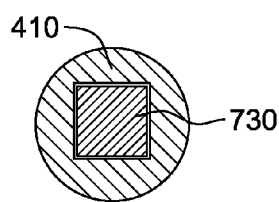
FIG. 7C is a cross-sectional elevational view of the shaft and clutch of FIG. 7B, taken along line 7C-7C thereof, in accordance with one or more aspects of the present invention.

FIGS. 7A-7C depict an alternate embodiment of the apparatus of FIG. 5, where the apparatus is modified to include a motor decoupling mechanism, generally denoted 700. In this configuration, decoupling mechanism 700 is a mechanical or electromechanical motor decoupling mechanism disposed between and coupling, in one embodiment, shaft 410 and a drive shaft 710 of motor 405. In one implementation, the decoupling mechanism may be a clutch which automatically decouples shaft 410 from drive shaft 710 with the interruption in power to the motor 405.

FIGS. 7B & 7C depict one embodiment of the decoupling mechanism. In this embodiment, two interlocking plates 720 are employed. The interlocking plates 720 include a first plate 721 and a second plate 722, which are respectively coupled to drive shaft 710 and shaft 410. Additionally, an electromagnet 711 and a permanent magnet 712 are associated with first plate 721, and second plate 722, respectively. In this implementation, the circuit lines 401, 402 are connected via bushing connectors 403 to electromagnet 711 to power the electromagnet when power is being supplied to the motor 405 (see FIG. 7A). When powered, electromagnet 711 exerts a force on permanent magnet 712, which results in the first and second plates being mechanical coupled to rotate together. This action overcomes a spring 735 force biasing plate 722 away from first plate 721. Interlocking members 723, 724 may be provided as mating features to lock the plates together under normal operation. Alternatively, friction pads, similar to those found in automotive clutches could be employed in the decoupling mechanism. In the depicted embodiment, second plate 722, with permanent magnet 712, is integrated with a post 730 which extends into an end of shaft 410 within an appropriately configured opening to receive post 730. The opening also contains the desired spring 735 biasing. By way of example, in one implementation, support post 730 is rectangular in shape, as illustrated in the cross-sectional view of FIG. 7C.

In operation, when power on circuit lines 401, 402 is interrupted, electromagnet 711 stops exerting a force on permanent magnet 712, which causes spring 735 to pull second plate 722 away from first plate 721, thereby separating the drive shaft 710 from shaft 410, and allowing shaft 410 to rotate freely from the drive shaft, using the rotational energy stored in the flywheel(s). When power is restored, electromagnet 711 exerts a force on permanent magnet 712, pulling plate 722 towards plate 721, and depending upon alignment, one shaft may rotate relative to the other until mating features 723, 724 are aligned, and the shafts properly couple through mechanism 700, allowing them to spin in unison.

Note that if the locking feature of FIG. 7B is replaced by, for instance, friction pads, then the reactivation of the electromagnet is sufficient to cause the two shafts to couple and to begin to rotate at a decreasing speed, until the motor has sped up sufficiently to exceed the current shaft speed, and once again begin accelerating the coupled shafts and the storing of energy back into the flywheel(s). In this configuration, there may be initial slippage between the shaft joining plates until the drive shaft has built up sufficient rotational speed.

Figure 7D:
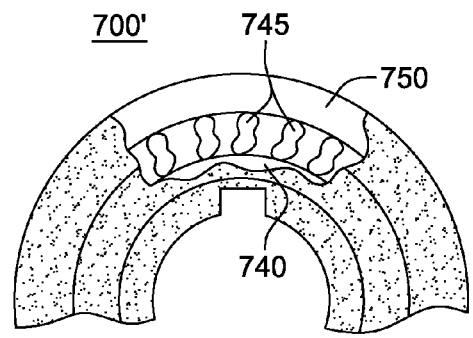
FIG. 7D depicts an alternate embodiment of the motor decoupling mechanism, or clutch, of the apparatus of FIG. 7A, in accordance with one or more aspects of the present invention.

FIG. 7D depicts an alternate embodiment of an emf decoupling mechanism 700' for an apparatus such as depicted in FIG. 7A. In this alternate embodiment, the motor decoupling mechanism is implemented as a sprag clutch with an inner-rotational member 740 coupled to an outer-rotational member 750 via multiple sprags 745. Sprags 745 rotate on their own individual axis, but do not spin around the center of the shaft with either the inner or outer-rotational members.

In normal operation, inner-rotational member 740 is connected to drive motor 710 (see FIG. 7A), and spins at the motor driving speed. This driving motion causes sprags 745 to rotate counterclockwise, and enter a "locked" position, thus mechanically coupling inner-rotational member 740 to outer-rotational member 750. Outer rotational member 750 is locked to inner-rotational member 740, and has the same rotational speed. The outer-rotational member 750 is mechanically coupled to shaft 410, which drives mechanical fans 340, and also flywheel(s) 520, as shown in FIG. 7A. As outer-rotational member 750 speeds up, it will continue to allow kenetic energy to be stored in the flywheel(s) of the apparatus.

In the event of a power interruption, the loss of electrical power causes motor 405 to lose speed, thus reducing speed of inner-rotational member 740. The outer-rotational member 750 also reduces speed in this event, but due to the larger momentum resulting from the presence of the flywheel, maintains a rotational speed greater than the inner-rotational member. Thus, the outer-rotational member 750 spins relatively faster (in the same direction as the inner-rotational member), compared to the inner-rotational member. The higher relative speed causes sprags 745 to rotate clockwise, and enter an "unlocked" position, allowing the outer-rotational member 750 to freely spin and mechanically uncouple from the inner rotational member 740. Thus, as long as the outer-rotational member continues to spin relatively faster than the inner-rotational member, which is connected to the motor drive, the outer-rotational member will spin freely, and not be slowed by the frictional losses at the motor.

Once power is restored to the motor, the motor and the attached inner-rotational member 740 of the decoupling mechanism 700' will begin to accelerate, thus increasing speed. For a small period of time, the outer-rotational shaft will continue to freely spin. However, as motor 405 accelerates, the inner-rotational member will eventually rotate at a speed exceeding the outer-rotational member. When this happens, sprags 745 will rotate to the counterclockwise position, and couple the shafts back together, again causing the outer-rotational member 750 to match in rotational speed the inner-rotational speed 740, and allow kinetic energy to be stored back into the flywheel(s) coupled to shaft 410.

Note from the above discussion that, in both decoupling mechanism embodiments of FIGS. 7B-7D, the reset process is automatic, requiring no manual input from service personnel in order to reestablish coupling between the drive shaft and the main shaft of the air-moving assembly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs.

As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
   an air-moving assembly, the air-moving assembly comprising:
      a shaft;
      one or more mechanical fans coupled to the shaft to rotate, at least in part, with the shaft; and
      a motor coupled to the shaft to rotatably drive the shaft;
   at least one flywheel coupled to the shaft of the air-moving assembly, with the one or more mechanical fans coupled to the shaft between the motor and the at least one flywheel, the at least one flywheel storing rotational energy during motor operation, and facilitating, for a specified period of time, continued rotation of the shaft during interruption in power to the motor;
   a motor decoupling mechanism coupled to the shaft between the motor and the one or more mechanical fans, the motor decoupling mechanism comprising a clutch coupling the shaft to a drive shaft of the motor, the drive shaft driving rotation of the shaft when the motor is operating and the clutch automatically decoupling the shaft from the drive shaft during interruption in power to the motor;
   wherein the at least one flywheel is sized and coupled to the shaft to facilitate, for the specified period of time, the continued rotation of the shaft at a specified percentage, or greater, rotational speed of the shaft compared with a rotational speed of the shaft when rotatably driven by the motor; and
   a flywheel extender housing attached to a side of the air-moving assembly, the flywheel extender housing comprising the at least one flywheel, and the apparatus further comprising a shaft extender coupled to the shaft to rotate therewith, the at least one flywheel being coupled to the shaft through the shaft extender.

2. The apparatus of claim 1, further comprising a computer room, and wherein the air-moving assembly comprises a computer-room, air-moving assembly providing, at least in part, air movement within the computer room, the computer room comprising one or more electronics racks to be cooled, and the specified period of time is preselected to be a time interval from a utility power interruption to the motor within which power should be reestablished to the motor.

3. The apparatus of claim 1, wherein the air-moving assembly comprises multiple mechanical fans coupled to the shaft to rotate, at least in part, therewith, the one or more mechanical fans being one or more mechanical fans of the multiple mechanical fans, and wherein one flywheel of the at least one flywheel is coupled to the shaft between two adjacent mechanical fans of the multiple mechanical fans coupled to the shaft.

4. The apparatus of claim 1, further comprising an electromotive force (emf) decoupling mechanism coupled to a circuit line facilitating powering of the motor, the electromotive force (emf) decoupling mechanism automatically opening or decoupling with the interruption in power to the motor, and preventing the continued rotation of the shaft during the interruption in power to the motor from providing a back electromotive force through the motor.

5. The apparatus of claim 4, wherein the electromotive force decoupling mechanism comprises an electromagnetic switch, the electromagnetic switch being coupled to the circuit line, and automatically switching to an open circuit state with loss of power to the motor through the circuit line.

6. The apparatus of claim 1, further comprising a computer room, wherein the air-moving assembly comprises a computer-room air-conditioner (CRAC) unit, the computer-room air-conditioner unit comprising an air-to-coolant heat exchanger and providing cooled air to the computer room, the computer room comprising one or more electronics racks to be cooled, and wherein the at least one flywheel is sized and coupled to provide, for the specified period of time, the continued rotation of the shaft to facilitate the computer-room air-conditioner unit providing additional cooled air to the data center during the interruption in power to the motor, and wherein the at least one flywheel is sized and coupled to the shaft to facilitate, for the specified period of time, the continued rotation of the shaft at the specified percentage, or greater, rotational speed of the shaft compared with the rotational speed of the shaft when rotatably driven by the motor.

7. A data center comprising:
   at least one electronics rack to be cooled; and
   an air-moving assembly facilitating, at least in part, air-cooling of the at least one electronics rack, the air-moving assembly comprising:
      a shaft;
      one or more mechanical fans coupled to the shaft to rotate, at least in part, with the shaft; and
      a motor coupled to the shaft to rotatably drive the shaft;
   at least one flywheel coupled to the shaft of the air-moving assembly, with the one or more mechanical fans coupled to the shaft between the motor and the at least one flywheel, the at least one flywheel storing rotational energy during motor operation, and facilitating for a specified period of time, continued rotation of the shaft during interruption in power to the motor;
   a motor decoupling mechanism coupled to the shaft between the motor and the one or more mechanical fans, the motor decoupling mechanism comprising a clutch coupling the shaft to a drive shaft of the motor, the drive shaft driving rotation of the shaft when the motor is operating and the clutch automatically decoupling the shaft from the drive shaft during interruption in power to the motor;

wherein the at least one flywheel is sized and coupled to the shaft to facilitate, for the specified period of time, the continued rotation of the shaft at a specified percentage, or greater, rotational speed of the shaft compared with a rotational speed of the shaft when rotatably driven by the motor; and a flywheel extender housing attached to a side of the air-moving assembly, the flywheel extender housing comprising the at least one flywheel, and the apparatus further comprising a shaft extender coupled to the shaft to rotate therewith, the at least one flywheel being coupled to the shaft through the shaft extender.

8. The data center of claim 7, wherein the specified period of time is preselected to be a time interval from a utility power interruption to the motor within which motor power should be reestablished.

9. The data center of claim 8, further comprising an electromotive force (emf) decoupling mechanism coupled to a circuit line facilitating powering of the motor, the electromotive force (emf) decoupling mechanism automatically opening or decoupling with the interruption in power to the motor, and preventing the continued rotation of the shaft during the interruption in power to the motor from providing a back electromotive force through the motor.

10. The data center of claim 9, wherein the electromotive force decoupling mechanism comprises an electromagnetic switch, the electromagnetic switch being coupled to the circuit line, and automatically switching to an open circuit state with loss of power to the motor through the circuit line.

11. The data center of claim 8, wherein the air-moving assembly is a computer-room air-conditioner (CRAC) unit, the computer-room air-conditioner unit comprising an air-to-coolant heat exchanger and providing cooled air to the data center, and the at least one flywheel is sized and coupled to provide, for the specified period of time, the continued rotation of the shaft to facilitate the computer-room air-conditioner unit providing additional cooled air to the data center during the interruption in power to the motor, and wherein the at least one flywheel is sized and coupled to the shaft to facilitate, for the specified period of time, the continued rotation of the shaft at the specified percentage, or greater, rotational speed of the shaft compared with the rotational speed of the shaft when rotatably driven by the motor.

12. A method comprising:
providing at least one flywheel sized for an air-moving assembly, the air-moving assembly comprising:
a shaft;
one or more mechanical fans coupled to the shaft to rotate, at least in part, with the shaft; and
a motor coupled to the shaft to rotatably drive the shaft;
rotatably coupling the at least one flywheel to the shaft of the air-moving assembly, wherein the at least one flywheel is sized and coupled to the shaft with the one or more mechanical fans coupled to the shaft between the motor and the at least one flywheel, to store rotational energy therein during motor operation, and to facilitate, for a specified period of time, continued rotation of the shaft during interruption in power to the motor, and wherein the at least one flywheel is sized and coupled to the shaft to facilitate, for the specified period of time, the continued rotation of the shaft at a specified percentage, or greater, rotational speed of the shaft compared with a rotational speed of the shaft when rotatably driven by the motor;

providing a motor decoupling mechanism coupled to the shaft between the motor and the one or more mechanical fans, the motor decoupling mechanism comprising a clutch coupling the shaft to a drive shaft of the motor, the drive shaft driving rotation of the shaft when the motor is operating and the clutch automatically decoupling the shaft from the drive shaft during interruption in power to the motor; and providing a flywheel extender housing attached to a side of the air-moving assembly, the flywheel extender housing comprising the at least one flywheel, and the assembly further comprising a shaft extender coupled to the shaft to rotate therewith, the at least one flywheel being coupled to the shaft through the shaft extender.

13. The method of claim 12, wherein the air-moving assembly comprises a computer-room, air-moving assembly providing, at least in part, air movement within the computer room, the computer room comprising one or more electronics racks to be cooled, and the specified period of time is preselected to be a time interval from a utility power interruption to the motor within which power should be reestablished to the motor.

14. The method of claim 12, wherein the air-moving assembly comprises multiple mechanical fans coupled to the shaft to rotate, at least in part, therewith, the one or more mechanical fans being one or more mechanical fans of the multiple mechanical fans, and wherein one flywheel of the at least one flywheel is coupled to the shaft between two adjacent mechanical fans of the multiple mechanical fans coupled to the shaft.

15. The method of claim 12, further comprising providing an electromotive force (emf) decoupling mechanism coupled to a circuit line facilitating powering of the motor, the electromotive force (emf) decoupling mechanism automatically opening or decoupling with the interruption in power to the motor, and preventing the continued rotation of the shaft during the interruption in power to the motor from providing a back electromotive force through the motor.

16. The method of claim 15, wherein the electromotive force decoupling mechanism comprises an electromagnetic switch, the electromagnetic switch being coupled to the circuit line, and automatically switching to an open circuit state with loss of power to the motor through the circuit line.

* * * * *